United States Patent [19]

Singer et al.

[11] 4,375,620

[45] Mar. 1, 1983

[54] PSEUDO-ATMOSPHERIC NOISE GENERATOR WITH CONTROL OF TEMPORAL CHARACTERISTICS

[75] Inventors: Paul A. Singer, Santee; Roger K. Cernius, El Cajon, both of Calif.

[73] Assignee: The United States of America as represented by the Secretary of the Navy, Washington, D.C.

[21] Appl. No.: 216,715

[22] Filed: Dec. 15, 1980

[51] Int. Cl.³ ........................................... H03B 29/00
[52] U.S. Cl. ...................................... 331/78; 364/717
[58] Field of Search ........................... 331/78; 364/717

[56] References Cited

U.S. PATENT DOCUMENTS 3,617,925 11/1971 Bensema et al. ..................... 331/78
3,777,278 12/1973 Majeau et al. ....................... 331/78
4,173,000 10/1979 Singer et al. ........................ 331/78

*Primary Examiner*—Siegfried H. Grimm

*Attorney, Agent, or Firm*—Robert F. Beers; Ervin F. Johnston; Thomas Glenn Keough

[57] ABSTRACT

An improved pseudo-atmospheric noise generator includes the capability for producing noise in the VLF/LF spectrum with known amplitude probability distributions while controlling the temporal characteristics of the simulated impulses. The outputs from a number of pseudo-random bit generators are selected by a microprocessor in accordance with expected or anticipated atmospheric disturbances from a number of geographical regions. The microprocessor selected outputs are fed to a digital-to-analog converter which feeds the converted signals to a summer. An independent Gaussian noise source is coupled to the summer and the outputs from the Gaussian noise source and the digital-to-analog converter are combined to create a composite pseudo-atmospheric noise signal. The improvement also includes capability for self-testing and set up.

10 Claims, 7 Drawing Figures (A) LINEAR COMBINATION OF GAUSSIAN NOISE COMPONENT WITH POWER RAYLEIGH COMPONENT (IMPULSE NOISE).
(B) POWER RAYLEIGH COMPONENT PIECEWISE GENERATED BY PROGRAMMABLE PROBABILITY GATES IN 6 dB AMPLITUDE STEPS.
(C) DIGITAL GENERATION OF GAUSSIAN COMPONENT BY $2^{44}-1$ BIT PRBG AND LPF.

PSEUDO-ATMOSPHERIC NOISE GENERATOR WITH CONTROL OF TEMPORAL CHARACTERISTICS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Atmospheric noise at VLF/LF is highly impulsive and non-stationary over any time interval greater than 10 to 15 minutes. Because of the excellent propagation of energy in this frequency range the noise, which is produced by lightning discharges, is characterized by high dynamic range impulses on the order of 60 dB or more over that of receiver internally generated thermal noise. The noise in general, can be described by a low amplitude Gaussian-type background noise in combination with that of the impulsive noise. Because of the non-stationary characteristics of VLF/LF atmospheric noise, attempts have been made in the past to simulate its characteristics in such a manner that communication systems could be evaluated with repeatability. Atmospheric noise generators to date have not been designed to provide the noise with the temporal characteristics of "real world" atmospheric noise.

The design concept for a forerunner of the present inventive concept is depicted in FIGS. 1 through 3 of the drawings and is fully disclosed in U.S. Pat. No. 4,173,000 issued Oct. 30, 1979. This design has a continuous impulse noise amplitude probability distribution digitally estimated in a piece-wise fashion in 6 dB amplitude increments. These increments are linearly combined with a digitally generated Gaussian noise component for simulation of the VLF/LF atmospheric noise.

Description and operation of the prior art noise generator calls for its being set for a 72 dB dynamic range using 12 lines of input to a digital-to-analog converter (DAC). A clock is used to drive seven pseudo random-bit generators (PRBGs) of linear feedback type. One of the PRBGs is driven directly by the clock while the other six are driven by the clock signal after being divided down in the divide-by-N circuit. From the slower PRBGs various lines from each stage are wired to the 12 programmable probability gates. Only one line from each of the slower PRBG stages is used for input to each of the programmable probability gates. No more than six lines from any PRBG goes to any programmable probability gate. The programmable probability gate is a hard wired logical device used to convert the outputs of the PRBGs into pulses which will occur at a specified probability. For example, the output of the PRBGs is in the form of binary logic level voltages which are denoted as "1" or "0". The "1" or "0"s from PRBG lines to that particular programmable probability gate shown in FIG. 3 are used in two ways. First, the lines are input to a "nand" gate. These inputs are nanded together having the resultant output enabling the MUX "M". All inputs have to be at a logic "1" for the output of the nand gate to be a logic "0"; else the output is a "1". If the enable input to the MUX "M" is a "1", the output is a zero. If the input is a "0", the output of MUX "M" is determined by the data inputs and the data selected input. The data select input comes from individual taps from the stages of the slower PRBGs. The output when the enable is zero is determined by the table below.

| A | B | C | Data Selected |
|---|---|---|---|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

One of the data input lines is the output of MUX "N" while the remainder come from the header socket.

MUX "N" is similar to MUX "M" but with all data inputs coming from the header socket, the enable set to a fixed logic "0", the data select lines come from the slower pseudo random sequence generator (PRSGs), and the output going to one of the "data input lines of MUX "M". Note the programmable nature of the gate comes from the fact that the number of logic "1"s or logic "0"s at the input to either MUX "M" or MUX "N" can be altered by wiring a header which will fit into the header socket. Thus, if the number of inputs to the nand gate is denoted by "K", the number of logic "1" inputs to MUX "M" is denoted "M", and the number of logic "1" inputs to MUX "N" is denoted "n", the probability of a logic "1" output is given approximately by $$P(1) = \frac{8m + n}{2^{(6+K)}}$$

where $0 \leq K$ $0 \leq m \leq 7$ $1 \leq n \leq 8$

In FIG. 2, the output of each of the 12 programmable probability gates goes to a corresponding one-shot multivibrator and then to the digital-to-analog converter or DAC. Assume the least significant input of the DAC when pulsed by the one-shot produces an output level of A, then the output is a random series of pulses ranging in amplitude from A to A X $(2^n-1)$ where n equals the number of address lines used in the DAC.

The output of the DAC and the output of the fast PRSG, which is Gaussian in nature, are inputs to the summing bus where Gaussian noise is linearly summed with the impulsive noise. The ratio of the Gaussian noise relative to impulsive noise is a function of two fixed resistors in the summing network.

The output of the summing network is then passed through a low pass filter to limit the bandwidth of the output. Now that the energy has been confined to a limited bandwidth it can be amplified by a wide dynamic range amplifier to produce the desired output at a convenient level.

The prior art system and method of pseudo-atmospheric noise generation though a noteworthy advance in the state-of-the-art did not fully realize several features. First, there was no control of the temporal characteristics of the impulse noises. Secondly, although not readily apparent the prior art unit required a sophisticated noise analyzer for calibration, self-testing, or setting up of signal-to-noise ratio for modem testing. And, thirdly, the old generator could produce only one amplitude probability distribution at a time from the programmable probability gate settings.

Thus, there is a continuing need in the state-of-the-art for an improved pseudo-atmospheric noise generator that has the flexibility and capability for changing its temporal characteristic and amplitude probability distributions to reflect disturbances under a variety of changed circumstances.

SUMMARY OF THE INVENTION

The present invention is directed to providing an improved pseudo atmospheric noise generator for producing noise in the VLF/LF spectrum with known amplitude probability distributions while controlling the temporal characteristics of the impulses. A means is provided for having amplitude probability distributions and includes a plurality of pseudo random bit generators. It further includes a means coupled to receive the outputs from the pseudo random bit generators for storing and selecting the outputs from the pseudo random bit generators. A microprocessor means is coupled to the storing and selecting means for providing distributions of bursts of pulses representative of geographical, temporal probability distributions for regional storm centers. A means is coupled to the distribution providing means for converting digital pulses to analog signals of random amplitude and distribution as determined by the distribution providing means. A summing means receives the outputs from the analog signal converting means and the output from a Gaussian noise source means to add the signals together in a selective ratio to provide the desired pseudo random atmospheric noise signal.

It is a prime object of the invention to provide an improved pseudo atmospheric noise generator.

Yet another object of the invention is to provide an improved noise generator having the capability for providing signals representative of geographic, temporal probability distributions.

Yet another object is to provide a noise generator that allows the generation of atmospheric noise for any site on the surface of the earth at any season or time of day.

A further object is to provide for control of the temporal characteristics of the pulses used in generating the impulse noise.

Still another object is to provide an improved pseudo-atmospheric noise generator allowing for self-test and ease of signal-to-nose creation.

Yet a further object is to provide an improved pseudo-atmospheric noise generator having greater flexibility in producing different amplitude probability distributions to be algebraically added to a Gaussian noise background.

These and other objects, advantages and novel features of the invention will become apparent from the following detailed description of the invention when considered in conjunction with the accompanying drawings.

BRIEF DESCRIPTION OF THE DRAWINGS

FIG. 7 is an elaboration of a modification of a portion of the improved pseudo-atmospheric noise generator.

DESCRIPTION OF THE PREFERRED EMBODIMENT

Figure 1:
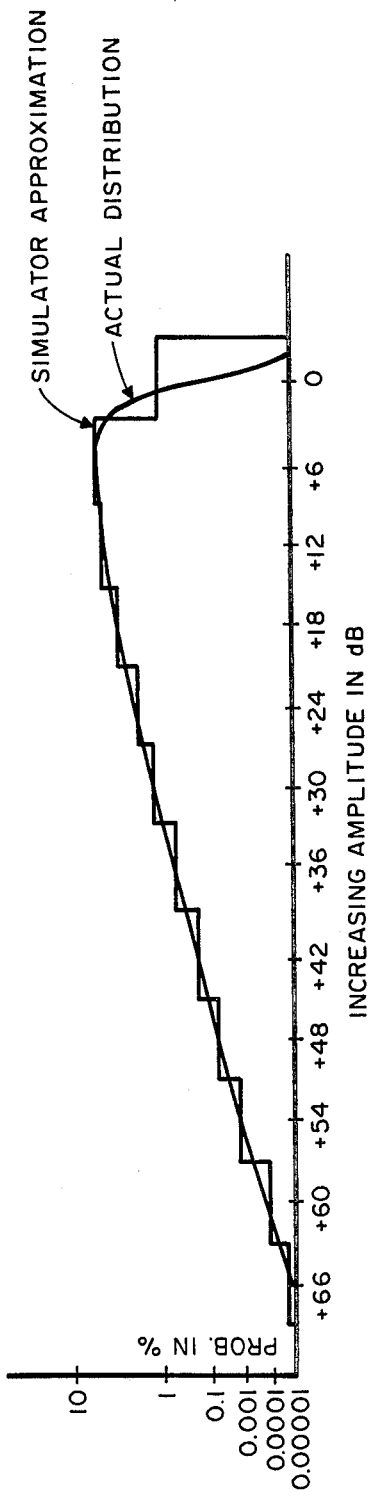
FIG. 1 is a prior art representation of amplitude vs. probability distribution.

The present design concept for the improved pseudo-atmospheric noise generator (PANG) is to include a function for producing noise with known amplitude probability distributions (APDs) while controlling the temporal characteristics of the impulses. The continuous impulse amplitude probability distribution is digitally estimated (as in the old technique) in a piece-wise fasion in 6 dB amplitude increments (shown in FIG. 1). These increments are linearly combined with a digitally generated Gaussian noise component for simulation of the VLF/LF atmospheric noise. The timing of the impulses will be controlled such that certain characteristics (e.g. pulse spacing) can be produced. The PANG will include capability for self-check, and a phase of operation to allow easy setup of signal-to-noise ratio by producing Gaussian noise only or pulse train output only.

Figure 4:
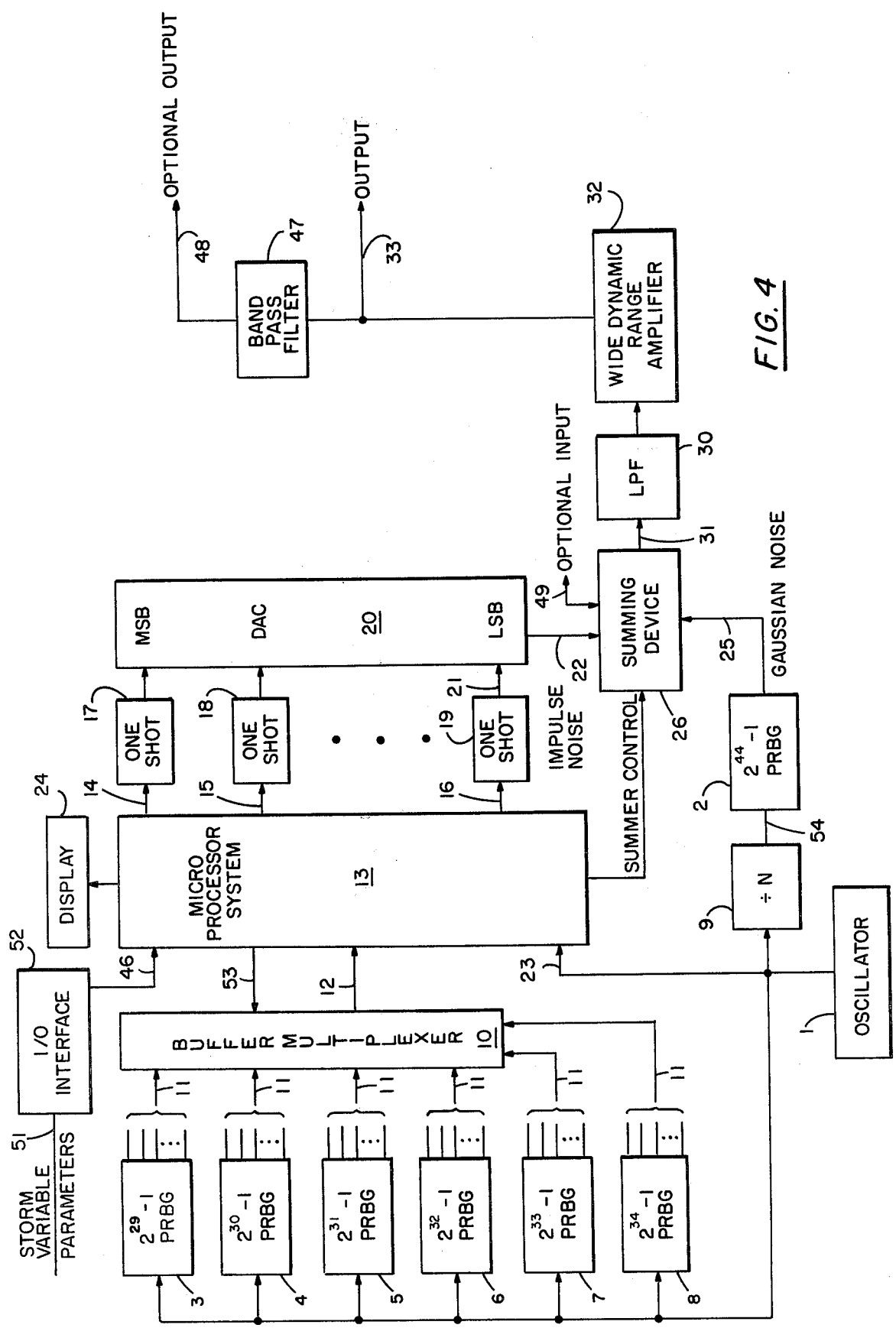
FIG. 4 is a schematic representation of the inventive concept of this invention.

The following is a description of the new technique and how it operates. As shown in FIG. 4, the oscillator 1 is used to drive seven high speed pseudo random bit generators (PRBGs of linear feedback shift register type) (2,3,4,5,6,7,8). The oscillator 1 frequency is set such that the combination of all states of all seven high speed PRBGs does not repeat in less than 24 hours. Various lines from the PRBGs 3, 4, 5, 6, 7 and 8 are wired to a buffer/multiplexer 10. The buffer/multiplexer 10 has two functions: (a) temporary storage of PRBG outputs 11 to aid input of "n" pairs of uniform random numbers 12 to a microprocessor system 13, and (b) selection of PRBG output 11 to be used for input 12 to microprocessor 13. The microprocessor 13 stores programs and look up tables which represent temporal probability distributions for all storm centers over the earth's surface for a given season and time of day. The microprocessor 13 could consist of one or more of any of the popular 8-bit (example: Z'log Z80) or 16-bit (example: Z log Z8000) microprocessors. Typically the microprocessor would consist of a Central Processing Unit (example: Z8001/Z8002), Memory Management Unit (example: Z8010), Read Only Memory and/or Random Access Memory plus interface circuits.

Variables for all probability distributions such as pulses/burst, time between impulses of a burst, impulse amplitudes/burst, storm locations and burst/unit time for each storm center initially are loaded before the noise process is initiated into microprocessor system 13. Upon completion of the initial load and a start command by the operator a number of software functions are then performed. The functions to be performed in the microprocessor software would be:

(a) input of variables for all intra-cloud and ground return stroke probability distributions such as pulses/burst, time between impulses of a burst, impulse amplitudes/burst, storm locations and burst/unit time for each storm center input line 51 through I/O interface 52 and into the microprocessor system by line 46;

(b) input of PRBG values (by 12);

(c) rejection of values in (b) that are outside of limits of a function. Example: if the input range of a function was between 0.5 and 1.0, a value of 0.25 would be rejected. Correspondingly limits of values for an allowed set of ranges could be employed. The accepted values generate random variables representing samples of each of the above described probability distributions in (a) for each storm center; "j" represents the number of probability distributions to be generated by microprocessor 13 and "$n_1$" represents the number of random number pairs to be generated for each probability distribution "1". The value of "$n_1$" will vary dependent on the nature of each probability distribution. Criteria for acceptance or rejection of PRBG values (by 12) is based on Acceptance-Rejection Methods described in the "Handbook of Mathematical Functions With Formulas, Graphs, and Mathematical Tables", National Bureau of Standards Applied Mathematics Series 55, Department of Commerce, June 1964.

(d) Once having generated a burst for a given storm center microprocessor system 13 adjusts the levels by using a simple single mode propagation path algorithm to represent the received noise field at the reception point. An example of the algorithm to be used is the Rothmuller equivalent single mode where the great circle distance for the propagation path is determined by spherical geometry. The amount of attenuation of the signal is set at a fixed value (i.e., so many dB loss per kilometer) for East to West propagation and a different value for West to East propagation.

(e) After the microprocessor system performs (d) for each storm center it adds the accumulation of all storm centers in an Arithmetic Logic Unit (ALU) contained within the microprocessor system. The ALU output lines 14, 15 and 16 are connected to a particular one-shot 17 or 18 or . . . or 19 and then to the digital-to-analog converter (DAC) 20.

Assume the least significant input 21 of DAC 20 is pulsed by one-shot 19 and produces an output level at 22 of A, then output 22 is a series of pulses ranging in amplitude from A to AX ($2^m-1$), where m equals the number of address lines in DAC 20.

The order and amplitude of the pulses at 22 is a direct result of the stored program in microprocessor 13 and the PRBG inputs 11 via the buffer/multiplexer 10 to the microprocessor (13 via 12). The microprocessor will use an input 23 from the oscillator 1 to keep track of the time. The time or corresponding symbols will be displayed in display 24.

As shown in FIG. 4, the Gaussian noise component is derived by a division by "N" circuit 9 from the output 23 of oscillator 1. Output 54 of ÷N circuit 9 is used to drive the PRBG generator 2. The output of PRBG 2 is white Gaussian noise up to a frequency of 35 kHz.

Figure 5:
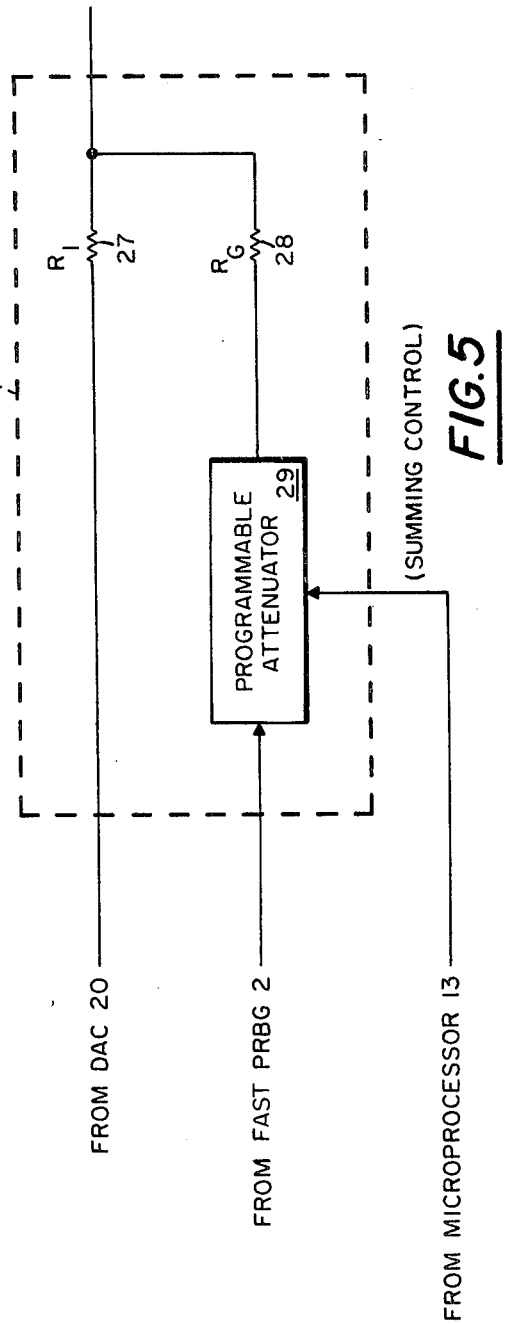
FIG. 5 depicts a detail of the summing device of the present inventive concept.
Figure 2:
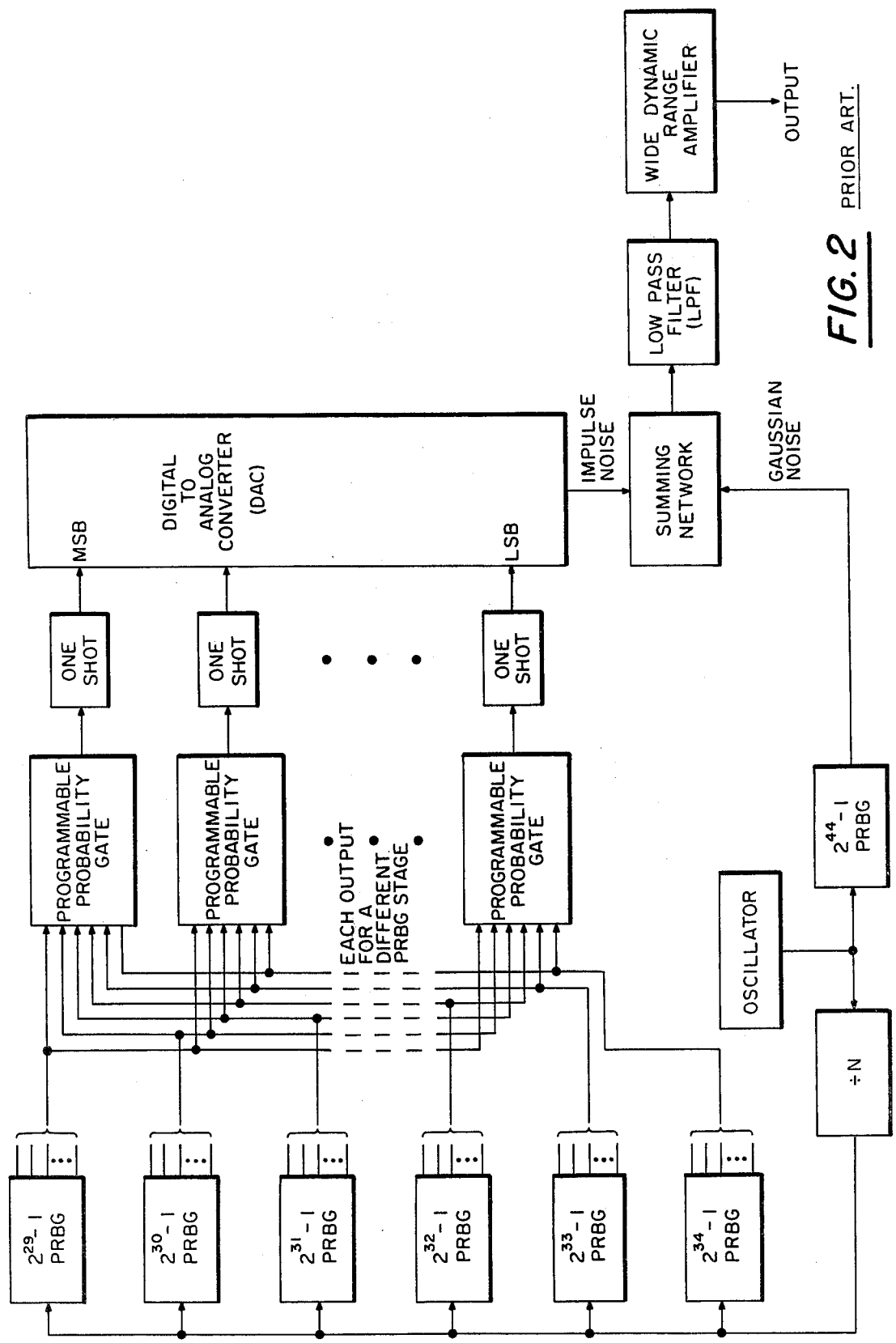
FIG. 2 sets forth the schematic embodiment of the prior art device of U.S. Pat. No. 4,173,000.
Figure 3:
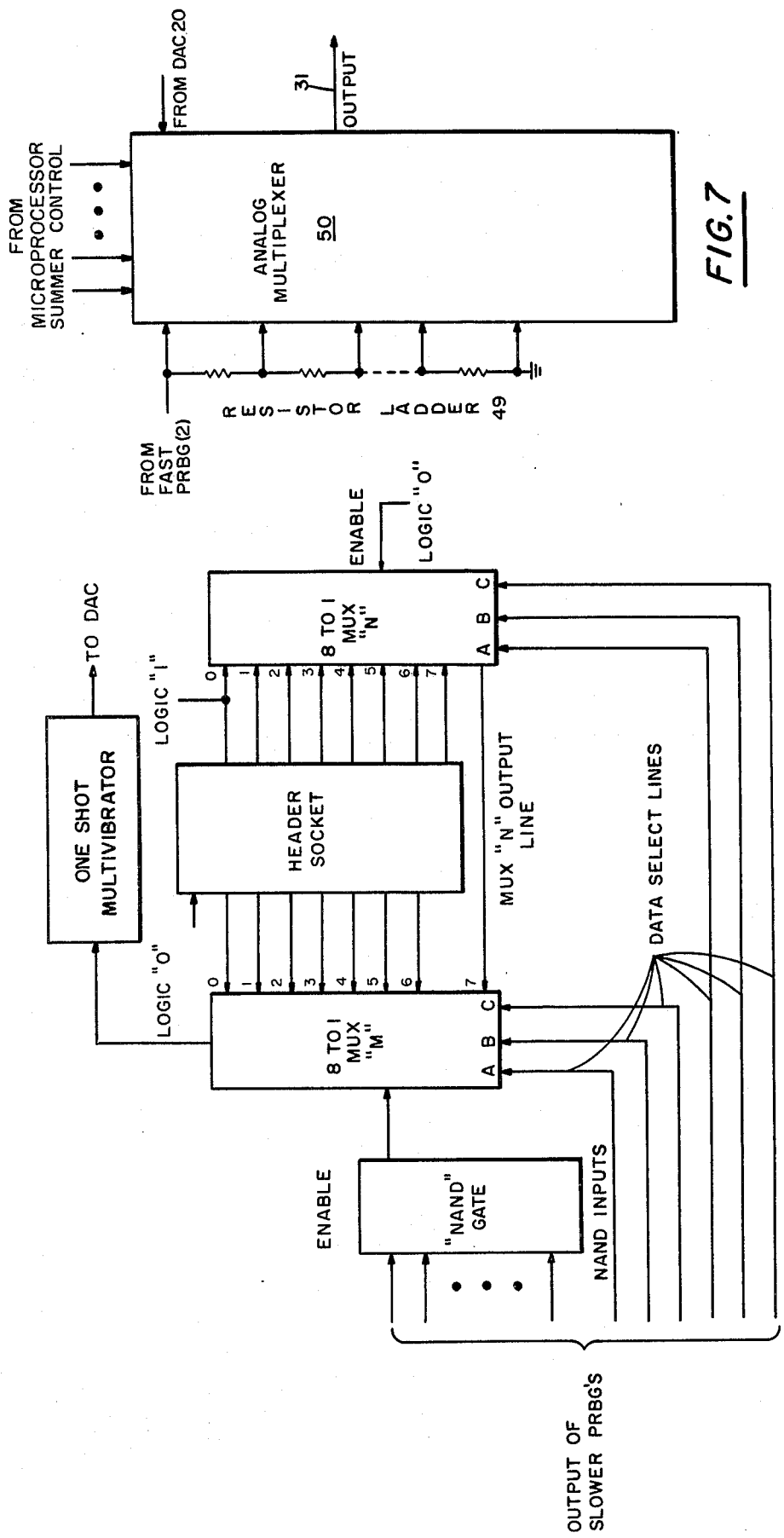
FIG. 3 depicts a prior art programmable probability gate and one-shot multivibrator.

The output of the DAC 20 and the output of the PRBG 2 are inputs (at 22 and 25 respectively) to a summing device 26. As shown in FIG. 5, summing device 26 determines the proportion of Gaussian noise (simulating distant storms not generated in the microprocessor system) that is linearly summed with impulsive noise. The summing device consists of two resistors $R_I$ 27 and $R_G$ 28 and a programmable attenuator 29. The values of these two resistors, 27 and 28, determine the highest proportion of Gaussian noise that is linearly summed with the impulse noise. The greater the ratio of $R_I$ 27 to $R_G$ 28, the more Gaussian noise maximum relative to impulsive noise is possible. During normal operation the ratio of Gaussian noise to impulsive noise can be changed by increasing the path loss through the programmable attenuator 29 under summing control 25 from the microprocessor. This provides proper relative level between impulse noise from the DAC 20 and Gaussian noise from PRBG 2.

As shown in FIG. 4, the output of summing device 26 is passed through a loss pass filter 30 to limit the effective bandwidth of output 31. Now that the energy has been confined to a limited bandwidth, it is amplified by a wide dynamic range amplifier 32 to produce the desired output 33 at a convenient level.

Figure 6:
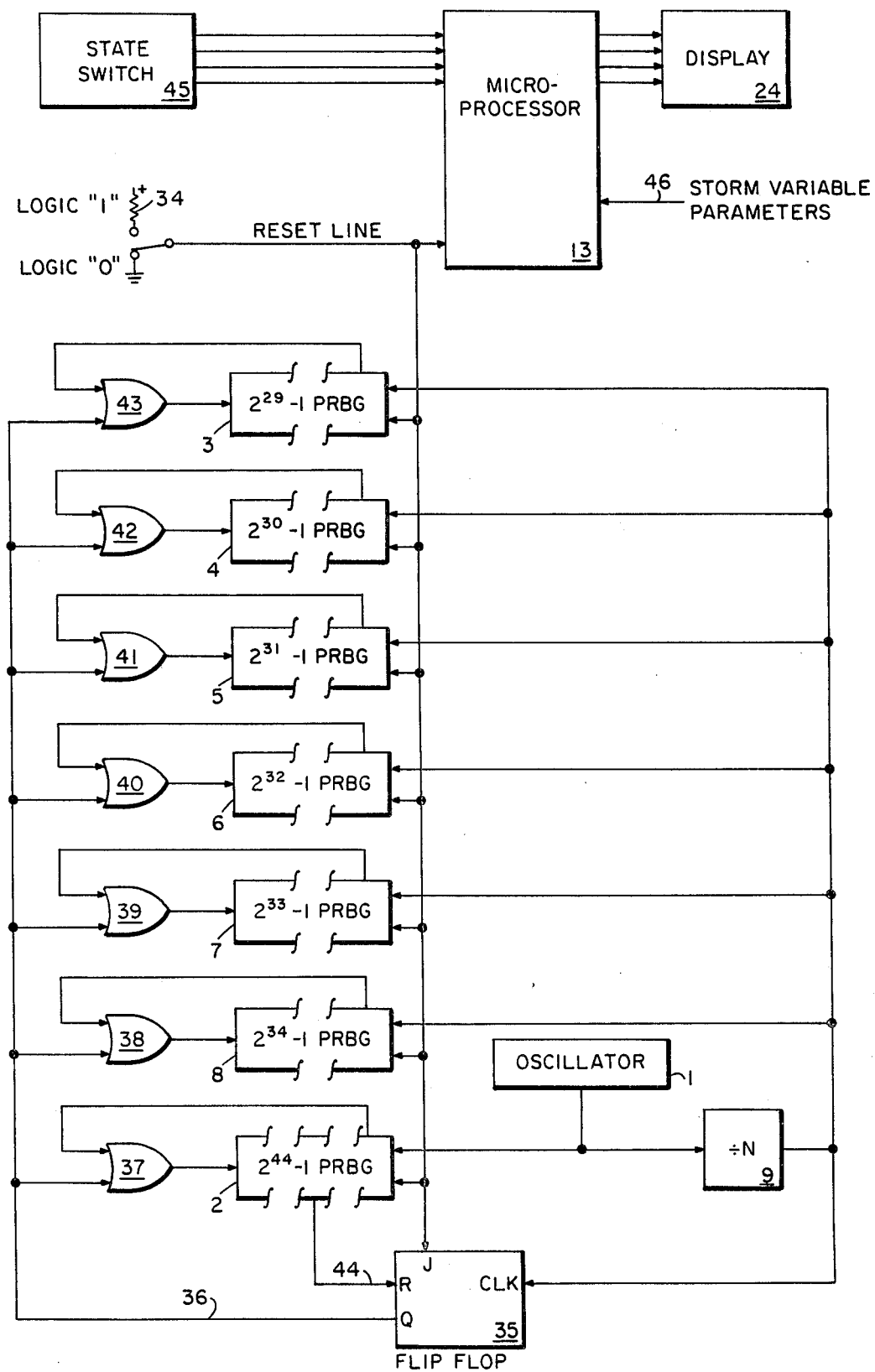
FIG. 6 shows a representation of the elements necessary to initiate the pseudo-atmospheric noise generator.

The PANG is initiated in two areas: (a) the PRBGs and the (b) microprocessor. The initialization of the PANG is shown in FIG. 6. Reset switch 34 is used to cause all stages of the PRBGs (2 through 8) to go to a logic "0" when the switch is set to a logic "1". This action also causes the J-K Flip-Flop 35 to have a "1" on Q output line 36. Each PRBG 2-8 has associated with it an "OR" gate 37-43. These gates 37-43 perform the logic "or" operation on the output of the PRBG "exclusive or" gate in the linear feedback shift register with the "Q" 36 of J-K Flip-Flop 35.

The result is the input to the first stage of the linear feedback shift register sequence which constitutes the PRBG. When reset switch 34 is moved to the logic "0" position, PRBGs 2-8 start to shift their respective data inputs from the "OR" gates 37-43 and load logic "1"s until the 25th stage of the PRBG 2 outputs at 44 a logic "1" which causes the J-K Flip-Flop 35 to change state and output (at 36) a logic "0".

When microprocessor 13 is reset by the switch at 34, it returns to a predetermined stored address and begins an initialization routine. As part of the routine, the microprocessor reads the setting of a hexidecimal position switch 45 which will be called the "state switch". Depending on state switch 45 setting, the program will branch to various routines called "states". Certain "states" will have unique identifiers which are the hexidecimal characters 0 through 9 and A through F. This state identifier will be displayed at 24. A parameter input 46 is used during the normal sequence of operation as described below.

In the normal sequence of events, state switch 45 is set to a value, reset switch 34 is toggled (logic "0" to "1", back to "0") and microprocessor 13, after execution, outputs at 24 the proper meaning and the PANG performs the corresponding operation.

An example of state definitions is given in the Table. In the example, after the power is first turned on, state switch 45 would be set to "0" and reset switch 34 would be toggled. The microprocessor would perform a self-check routine and display at 24 a "1" if the system failed the self-check or a "2" if the system passed the self-check. This self-check includes examining the inputs from PRBGs 3-8 to buffer/multiplexer 10 via 12. If the number of one's produced by the PRBGs is approximately equal to the number of zero's produced, then the PRBGs are assumed to be valid. Assume the unit passed (i.e. "2" is displayed at 24), the operator would set state switch 45 to "3" and toggle reset switch 34. The unit would accept serial parameters at 46 (e.g., input from a paper tape reader—not shown). If the parameters were of the proper format and passed a predetermined parity check, a "5" would be displayed at 24; else a "4" would be displayed at 24. The operator would next select one of two output patterns. A "6" at select switch 45 would give a Gaussian noise output at 33 by holding all one-shot inputs 14–16 constant.

This Gaussian noise can be displayed on an oscilloscope (not shown) and checks of the oscillator 1, PRBG 2, part of the summing device 26, LPF 30 and the wide-dynamic range amplifier 32 are thereby performed. Using the programmable attenuator 29, the RMS voltage level of the Gaussian noise at 33 is a fixed amount from the RMS voltage of the to be produced pseudo-atmospheric noise (e.g. RMS of Gaussian=RMS of atmospheric +10 dB). This allows setup of signal-to-noise ratios with conventional test equipment (e.g. HP 3400A) or as a Gaussian noise source. By selecting a "7" at 45, the output at 33 is a pulse train. The pulse train can be displayed on an oscilloscope. This pulse train checks out microprocessor 13, one-shots 14–16, DAC 20 and the remaining part of the summing device 26. The pulse train will be a continuous series of pulses with monotonic increasing amplitude followed by monotonic increasing time between pulses. The series of pulses is produced by generating a pattern at the microprocessor system outputs 14, 15, . . . 16 which correspond to a counting of a binary number (e.g. 00 . . . 00, followed by 00 . . . 01, followed by 00 . . . 10, etc.). The increasing time between pulses is caused by increasing the number of machine cycles between the outputs. The sequence is repeated as long as the state switch setting at 45 remains. These will be monitored by the external oscilloscope.

Unrelated to the sequence of events, a setting at 45 of "9" will produce at 33 a Gaussian noise output of maximum amplitude. A bandpass filter 47 of calibrated bandwidth will allow measurement of the Gaussian noise level at 48 by a True RMS voltmeter (not shown). This enables the PANG used as a Gaussian noise source in addition to a pseudo-atmospheric noise source.

The operator, ready now to produce pseudo-atmospheric noise, would set at 45 one of six time codes. These time codes represent periods of particular average APD's. The PANG normally would progress from A to B to C to D to E and to F (remaining in F until reset). The operator has the option to reset the unit to a particular time state (e.g., corresponding to 4 hour time blocks for a given season) with each time state corresponding to a particular average APD.

The inherent flexibility of the disclosed inventive concept allows various options. This gives operators latitude and versatility in operations. For example, the divide-by-N 9 can be under control of microprocessor 13 to change the value of "N" during operation.

Buffer/multiplexer 10 can be used as an accumulator and/or multiplier to either: (a) sum inputs 11 from different PRBGs (3 through 8) into a combined result; (b) sum inputs from individual PRBGs (3 or 4 or 5 or 6 or 7 or 8) into a different total; (c) segment the inputs 11 into floating point format with the exponential component and the fractional mantissa determined by methods (a) or (b) above.

The pulse length of the output of the one-shots (17 or 18 or . . . or 19) can be made a programmable function changeable by microprocessor 13 control.

The one-shots (17 through 19) can be eliminated for producing some desired noise environments. Microprocessor 13 would directly output to the DAC controlling pulse and pulse length on the input line.

A hardware counter or clock could be used to input time (at 23) to the microprocessor 13 instead of using the output of oscillator.

An alternate method of attenuating the Gaussian noise (see FIG. 5) as part of the summing device (26 in FIG. 4) is shown in FIG. 7. The output of the PRBG 2 is sent to a resistor ladder 49. Taps on the resistor ladder are input to an analog multiplexer 50. The proper level of output 31 is selected under control of microprocessor 13. An input from DAC 20 to multiplexer 50 is also provided.

A second unit consisting of PRBGs, buffer multiplexer, microprocessor, one-shots, and DAC could be added at 49. Correspondingly a third, or so on, units could be added at (49) as the number of storm centers to be simulated exceeds the capability of a single microprocessor system (13).

It may be possible to generate the $$\sum_{1}^{i} n_i$$

random number pairs internal to the microprocessor system. This would eliminate PRBGs 3 through 8 and the Buffer multiplexer 10.

Other approaches are available other than Acceptance-Rejection methods to generate probability distributions. Dependent on the nature of the probability distribution to be generated the microprocessor system might choose different algorithms than the Acceptance-Rejection method.

Obviously many modifications and variations of the present invention are possible in light of the above teachings. It is therefore to be understood that within the scope of the appended claims the invention may be practiced otherwise than as specifically described.

What is claimed is:

1. An improved pseudo-atmospheric noise generator for producing noise in the VLF/LF spectrum with known amplitude probability distributions while controlling the temporal characteristics of the impulses comprising:
    a plurality of pseudo-random bit generators having amplitude probability distribution outputs;
    means coupled to receive the outputs from the pseudo-random bit generators for storing and selecting the outputs from the pseudo-random bit generators;
    means coupled to the storing and selecting means for providing distribution of bursts of pulses representative of geographical temporal probability distributions for regional storms;
    means coupled to the distribution providing means for converting digital pulses to analog signals of the random amplitude and distribution as determined by the distribution providing means;
    a Gaussian noise source; and
    means coupled to the analog signal converting means and the Gaussian noise source for summing the Gaussian noise signals and the analog signals in a selective ratio to provide the desired pseudo-random atmospheric noise signal.

2. An improved pseudo-atmospheric noise generator according to claim 1 in which the distribution providing means is a microprocessor suitably interconnected to provide bursts of pulses representative of geographical temporal probability distributions for regional storms.

3. An improved pseudo-atmospheric noise generator according to claim 2 in which the summing means includes a pair of summing resistors selected to adjust the relative amplitudes of the output of the converting means and the output of the Gaussian noise source.

4. An improved pseudo-atmospheric noise generator according to claim 2 in which the summing means further includes a resistor ladder receiving the Gaussian noise signals and coupled to an adjustable analog multiplexer coupled to the analog signal converting means.

5. An improved pseudo-atmospheric noise generator according to claim 4 in which the magnitude of the output of the analog multiplexer is selected under control of the microprocessor.

6. An improved pseudo-atmospheric noise generator according to claim 2 in which the pseudo-random bit generators are driven by a common clock oscillator.

7. An improved pseudo-atmospheric noise generator according to claim 5 in which the pseudo-random bit generators are driven by a common clock oscillator.

8. An improved pseudo-atmospheric noise generator according to claim 6 in which the storing and selecting means is a buffer/multiplexer unit and the converting means is a digital-to-analog converter and the Gaussian noise source is a pseudo-random bit generator.

9. An improved pseudo-atmospheric noise generator according to claim 5 in which the storing and selecting means is a buffer/multiplexer unit and the converting means is a digital-to-analog converter and the Gaussian noise source is a pseudo-random bit generator.

10. A method of creating a reference noise level signal for test purposes comprising:
  attenuating a predetermined Gaussian noise pattern at a preselected amplitude;
  passing the attenuated Gaussian noise pattern through a low pass filter and a wide dynamic range amplifier; and
  feeding the resultant signal through a bandpass filter having a known equivalent noise band width so that the Gaussian noise then establishes for the user a simulated atmospheric noise RMS level.

* * * * *